United States Patent [19]
Kaneko

[11] Patent Number: 6,150,672
[45] Date of Patent: Nov. 21, 2000

[54] P-TYPE GROUP III-NITRIDE SEMICONDUCTOR DEVICE

[75] Inventor: Yawara Kaneko, Kanagawa, Japan

[73] Assignee: Agilent Technologies, Santa Clara, Calif.

[21] Appl. No.: 09/003,259

[22] Filed: Jan. 6, 1998

[30]       Foreign Application Priority Data

Jan. 16, 1997   [JP]   Japan ..................... 9-005339

[51] Int. Cl.[7] .................................................. H01L 33/00
[52] U.S. Cl. ................................................ 257/94; 257/22
[58] Field of Search ......................................... 257/22, 94

[56]                  References Cited

U.S. PATENT DOCUMENTS

| 5,689,123 | 11/1997 | Major et al. .............................. | 257/190 |
| 5,693,963 | 12/1997 | Fujimoto et al. .......................... | 257/94 |
| 5,786,603 | 7/1998 | Rennie et al. ............................. | 257/13 |
| 5,834,331 | 11/1998 | Razeghi .................................... | 438/40 |

FOREIGN PATENT DOCUMENTS

| 0703631A1 | 3/1996 | European Pat. Off. ........ | H01L 33/00 |
| 0723303A2 | 7/1996 | European Pat. Off. ........ | H01L 33/00 |
| 08213653 | 8/1996 | Japan ............................. | H01L 33/00 |

OTHER PUBLICATIONS

T. Mori et al., "Low Contact Resistivities on P–Type by using InGaN Contact layer", Extended Abstracts (The 57th Autumn Meeting, 1996), The Japan Society of Applied Physics, No. 1, 10a–ZF–9, p. 298.

M. E. Lin et al., "Nonalloyed Ohmic Contacts on GaN using InN/GaN Short–Period Superlattice", Appl. Phys. Lett., vol. 64, No. 19 (1994), pp. 2557–2559.

S. Miyoshi and K. Onaba, "Semi–Emperical Tight–Binding Calculation of the Electronic Structure of $GaP_{1-x}N_x$ (x=0.25, 0.5, 0.75) Alloys", Topical Workshop pm III–V Nitrides Sep. 21–23, 1995, Nagoya Japan, P–1.

Shiro Sakai et al., "Band Gap Energy and Band Lineup of III–V Alloy Semiconductors Incorporating Nitrogen and Boron", Jpn. J. Appl. Phys., vol. 32 (1993), pp. 4413–4417.

*Primary Examiner*—Olik Chaudhuri
*Assistant Examiner*—Douglas A. Wille

[57]                ABSTRACT

A Group III-nitride semiconductor device that has a low voltage-drop p-contact and comprises a substrate layer, a metal electrode and an intermediate layer sandwiched between the substrate layer and the metal electrode. The substrate layer is a layer of a p-type Group III-nitride semiconductor, and the intermediate layer includes a Group III-nitride semiconductor in which atoms of a Group V element other than nitrogen have been substituted for a fraction of nitrogen atoms. The Group III-nitride semiconductor device is made by providing a substrate including a p-type Group III-nitride semiconductor having an exposed surface. Atoms of a Group V element other than nitrogen are substituted for a fraction of the nitrogen atoms of the p-type Group III-nitride semiconductor to form an intermediate layer extending into the p-type Group III-nitride semiconductor from the exposed surface. Metal is then deposited on the exposed surface to form an electrode in electrical contact with the intermediate layer.

8 Claims, 3 Drawing Sheets

P-TYPE GROUP III-NITRIDE SEMICONDUCTOR DEVICE

FIELD OF THE INVENTION

The invention relates to a semiconductor device and a method of fabricating such a device, and particularly relates to a p-type Group III-nitride semiconductor device that has a low voltage-drop p-contact and a method of fabricating such a device.

BACKGROUND OF THE INVENTION

Group III-nitride compound semiconductors are promising materials for use in making semiconductor light-emitting devices, such as semiconductor lasers and semiconductor light-emitting diodes. Such compound semiconductors are also promising for use in making such circuit devices as metal semiconductor field-effect transistors (MESFETs). In particular, semiconductor lasers based on such Group III-nitride compound semiconductors such as gallium nitride (GaN), aluminum gallium nitride (AlGaN), indium gallium nitride (InGaN) or aluminum indium gallium nitride (AlInGaN) have great potential for generating light in the blue and violet wavelength ranges due to their substantially wider band gap than gallium arsenide, the material used to make lasers that emit red light. Lasers that generate light in the blue and violet are make it possible to increase the information storage density of optical storage devices. For example it is proposed to introduce digital versatile disks (DVDs) having a capacity of about 15 gigabits around the year 2000. A semiconductor material that includes at least gallium and nitrogen will be referred to in this disclosure as a gallium nitride semiconductor. A semiconductor that includes at least one Group III element and at least nitrogen will be called a Group III-nitride semiconductor. A semiconductor device that includes a Group III-nitride semiconductor will be called a Group III-nitride semiconductor device.

Although lasers based on gallium nitride semiconductors and capable of generating blue or violet light have been made, the lifetimes of current lasers based on gallium nitride semiconductors are extremely short at practical light emission intensities. Longer lifetimes are required. The major cause of the short lifetime of current devices is thermal degradation due to heat dissipation in the metal-to-semiconductor contacts through which current is fed through the device. The problem is particularly severe in the contact with a gallium nitride semiconductor doped with acceptor (p-type) impurities, i.e., the p-contact. The band gap of gallium nitride, at 3.4 eV, is comparatively high, which makes it difficult to make a low-resistance contact with this material.

FIG. 1 shows an example of an edge-emitting semiconductor laser 1 based on gallium nitride semiconductors. This device is formed by depositing the GaN buffer layer 3 on the sapphire substrate 2, and then successively depositing the n-type GaN contact layer 4, the n-type AlGaN cladding layer 6, the GaN waveguide layer 7, the InGaN multi-quantum well layer 8, the p-type GaN waveguide layer 9, the p-type AlGaN cladding layer 10, and the p-type GaN contact layer 11. The n-contact 13 is formed by dispositing the metal n electrode 5 on the n-type GaN contact layer 4 and the p-contact 14 is formed by depositing the metal p electrode 12 on the p-type GaN contact layer 11.

As will be described below, the contact resistance of the n-contact 13 is acceptably small. However, the contact resistance of the p-contact 14 between the p-type GaN contact layer 11 and the p electrode 12 is large. For example, in an typical device, the p electrode is formed from layers of gold and nickel and contacts an approximately 100 μm×100 μm area of the p-type GaN contact layer 11. Even if the specific contact resistance between the p electrode and the contact layer can be reduced to as little as $2 \times 10^{-1}$ $\Omega cm^2$, the p-contact has a contact resistance of 2,000 Ω. Consequently, a drive current of 100 mA will dissipate about 20 W of power at the p-contact.

In 671 NIKKEI ELECTRONICS, p. 9, Nikkei McGraw-Hill Co. (Sep. 23, 1996) is described a practical gallium nitride semiconductor-based laser that generates blue light at a wavelength of 417 nm and that has a light-emitting layer with an InGaN multi-quantum well layer structure having 25 quantum wells. The drive voltage of this device is 20 V and its drive current is 5 A, corresponding to a continuous power dissipation of 100 W. Consequently, the duty cycle of the light emitted by this laser is limited to 0.001 at room temperature, corresponding to an average power dissipation of 100 mW. This laser cannot generate light continuously, and therefore cannot be used in applications in which continuous light emission is required.

In other applications, the high contact resistance of the p-contact increases parasitic resistance, increases power consumption, and increases device temperature. The high contact resistance of the p-contact degrades the performance of essential functions of the semiconductor device, and shortens the life of the device. Therefore, a decrease in the contact resistance of the p-contact is sought.

Ideally, a p-contact or n-contact is a metal-to-semiconductor contact with a contact resistance that is sufficiently small that the contact resistance can be ignored compared with the bulk resistance of the semiconductor in series with the contact. The performance of a resistive contact can be characterized by its specific contact resistance, Rc. The specific contact resistance Rc is the reciprocal of the value partial differentiation of the drive current I with respect to the drive voltage V when the drive voltage of the semiconductor device is V=0. Since the contact resistance Rc depends exponentially on the height $\phi_B$ of the Schottky barrier between the metal electrode and the semiconductor, the contact resistance can be reduced by reducing the barrier height $\phi_B$. Moreover, in a region in which the concentration N of impurities in the semiconductor is sufficiently high for the tunnelling current to be dominant, the specific contact resistance Rc depends exponentially on $\phi_B N^{-\frac{1}{2}}$, so increasing the impurity concentration N is also effective to decrease the specific contact resistance.

In the device described in the above-mentioned NIKKEI ELECTRONICS article, the impurity concentration in the p-type GaN is believed to be about ten times greater than $10^{18}$ $cm^{-3}$. Such high impurity concentrations in p-type GaN result in a significant drop in the activation rate of the acceptors or in an extreme degradation of crystallinity, so favorable results are not obtained.

In *Nonalloyed Ohmic Contacts on GaN Using InN/GaN Short-Period Superlattice,* 64 APPL. PHYS. LETT., No. 19, pp. 2557–59, (May 9, 1994), M. E. Lin et al. disclose an example of depositing electrodes composed of two layers of Ti/Al on n-type GaN and annealing at 900° C. for a short time of 30 seconds to obtain a specific contact resistance of $8 \times 10^{-6}$ $\Omega.cm^2$. This paper also discloses an example of depositing an InN/GaN short-period superlattice (SPS) on a GaN layer and depositing a highly-doped InN layer on the SPS structure as a cap layer. A metal electrode is deposited on the cap layer. This structure provides a contact with a specific contact resistance of 8 ×10$^{-5}$ Ω.cm$^2$ without annealing. The quantum tunnel effect passing through the SPS conduction band is thought to narrow the effective band gap. FIG. 2 shows a schematic band diagram of the contact described in the article. To form the SPS, n-type InN and n-type GaN were alternately deposited in layers on an n-type GaN layer. The impurity level of the n-type GaN of the GaN layer and in the SPS was 5×10$^{18}$ cm$^{-3}$. The impurity level of the n-type InN of the cap layer and in the SPS was 1×10$^{19}$ cm$^{-3}$, so the metal-semiconductor structure whose band diagram is shown in FIG. 2 has no ability to function as a rectifier.

It is not clear whether either of the contact structures described above can be effectively used to lower the specific contact resistance of a p-contact made to p-type GaN or other p-type Group III-nitride semiconductor. Therefore, new ways of lowering the specific contact resistance of a p-contact made to p-type Group III-nitride semiconductors are being sought.

In devices based on GaAs semiconductors, $In_xGa_{1-x}As$ is used as a cap layer to which the p-contact is made. The band gap of $In_xGa_{1-x}As$ is 0.75 eV when x=0.53. This is narrower than the band gap of of GaAs, which is 1.42 eV. Lei et al., referred to above, describe this contact structure as providing a low specific contact resistance. Even if using a material with a narrower band gap than the p-type Group III-nitride semiconductor as a cap layer for the p-contact results in a decreased specific contact resistance, it is still unclear whether this contact structure can be fabricated without a complicated processing. $In_xGa_{1-x}N$ is a potential material for such a cap layer, but since the In content of the $In_xGa_{1-x}N$ has a relatively small bending effect on the band gap, $In_xGa_{1-x}N$ with a large In fraction must be used to narrow the band gap significantly. Diffusing In into GaN to form $In_xGa_{1-x}N$ with a large In fraction is difficult in itself, and additionally causes problems due to the large lattice mismatch between $In_xGa_{1-x}N$ and GaN.

In *Electrical Characteristics and Interface Structure of Ni/Au Contact Material on a p-Type GaN,* PROC. OF THE 42ND CONF. OF THE JPNS. SOC. OF APPL. PHYS., Lecture No. 30a-ZH-8, 19951 (Spring 1995)(in Japanese), Kobayashi et al. disclosed a specific contact resistance lowered to 10$^{-2}$ Ω.cm$^2$. This was achieved by activating at a high temperature (800° C.) GaN:Mg in which Mg impurities had been introduced into GaN. Metal electrodes of Au/Ni were vapor deposited after a hole concentration in the range of 4 to 8×10$^{17}$ cm$^{-3}$ had been reached. Finally, the structure was annealed. However, this value of specific resistance is insufficient by a number of orders of magnitude, and the demand for a lower specific contact resistance still remains.

If a p-contact with an acceptably-low specific contact resistance can be fabricated inexpensively on p-type GaN, and can provide better reliability, the possibility exists that a similar contact structure can be applied to other p-type Group III-nitride semiconductor devices and not just to p-type gallium nitride semiconductor devices.

What is needed is a p-contact between a metal electrode and a p-type Group III-nitride semiconductor that has a low specific contact resistance and that can be formed using a relatively simple method.

What is also needed is a p-contact between a metal electrode and a p-type Group III-nitride semiconductor with a low a Schottky barrier and a low specific contact resistance and that can be fabricated using a relatively simple method.

What is also needed is a p-type Group III-nitride semiconductor device that has a p-contact with a low Schottky barrier and a low specific contact resistance.

Finally, what is needed is a method of fabricating a p-type Group III-nitride semiconductor device that can easily be made using some of the same manufacturing processes as other elements of the device.

SUMMARY OF THE INVENTION

The invention provides a Group III-nitride semiconductor device that has a low voltage-drop p-contact and that comprises a substrate layer, a metal electrode and an intermediate layer sandwiched between the substrate layer and the metal electrode. The substrate layer is a layer of a p-type Group III-nitride semiconductor, and the intermediate layer includes a Group III-nitride semiconductor in which atoms of a Group V element other than nitrogen have been substituted for a fraction of nitrogen atoms.

The invention also provides a method of fabricating a Group III-nitride semiconductor device that has a low voltage-drop p-contact. In the method, a substrate including a p-type Group III-nitride semiconductor having an exposed surface is provided. Atoms of a Group V element other than nitrogen are substituted for a fraction of the nitrogen atoms of the p-type Group III-nitride semiconductor to form an intermediate layer extending into the p-type Group III-nitride semiconductor from the exposed surface. Metal is then deposited on the exposed surface to form an electrode in electrical contact with the intermediate layer.

DETAILED DESCRIPTION OF THE INVENTION

Figure 1:
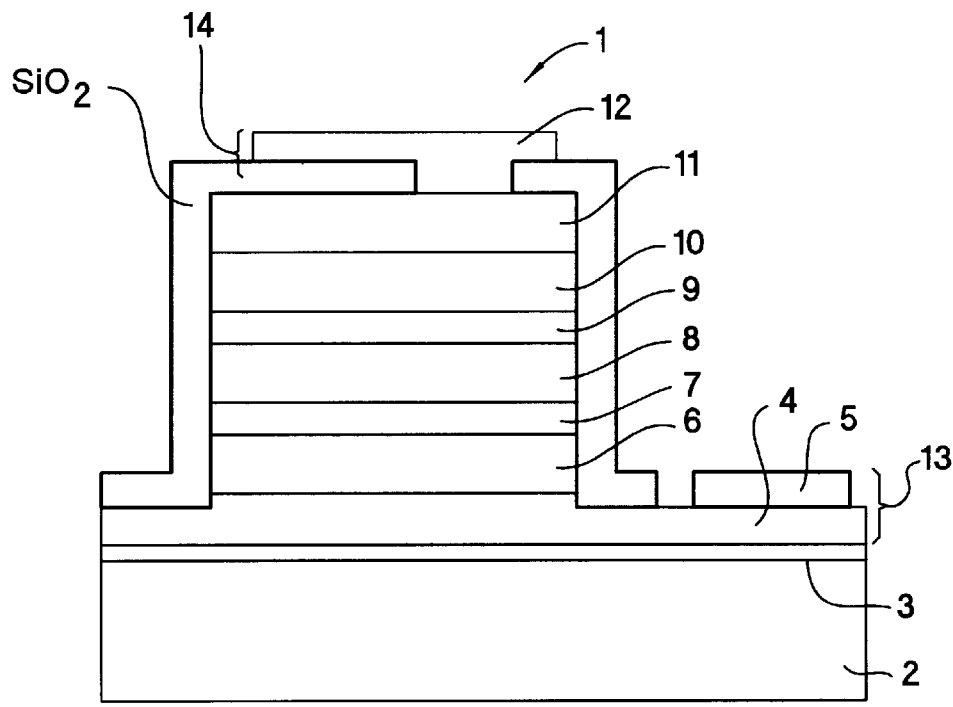
FIG. 1 is a cross-sectional view of an example of a conventional edge-emitting Group III-nitride semiconductor laser.
Figure 2:
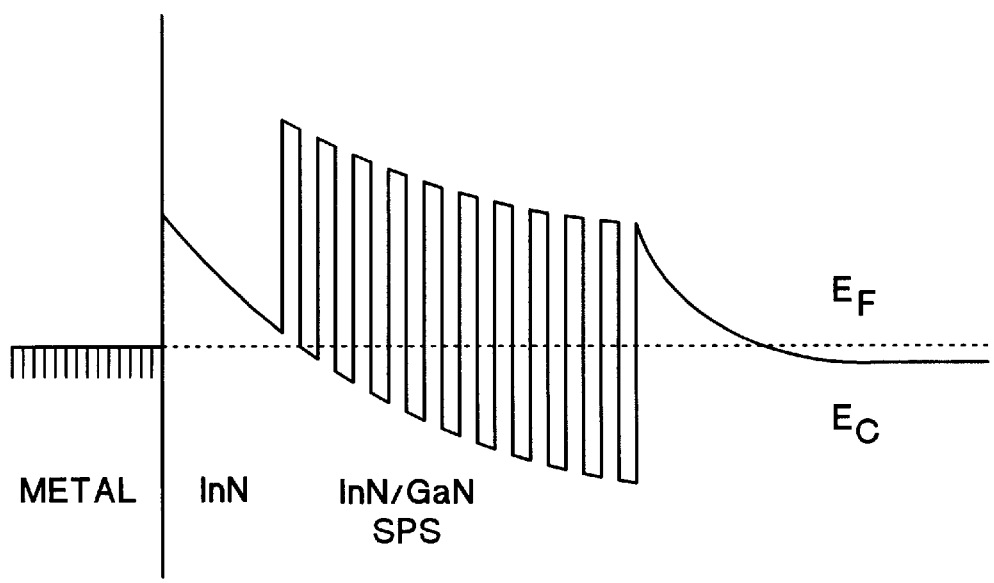
FIG. 2 is a schematic band diagram of a known n-contact in which an In/Ga short-period superlattice and an InN cap layer are deposited on a GaN layer.
Figure 3:
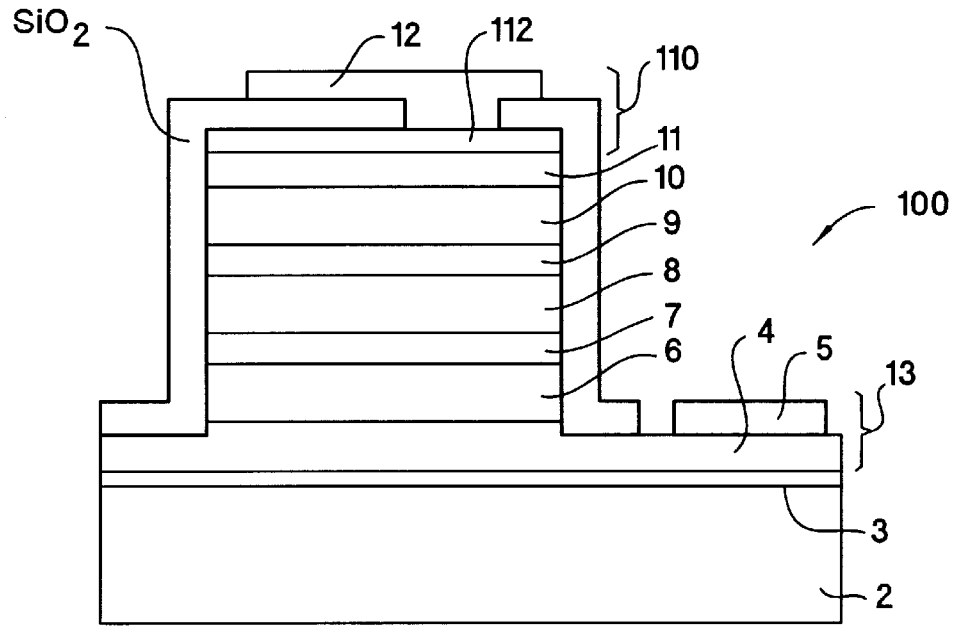
FIG. 3 is a cross-sectional view of an example of an edge-emitting Group III-nitride semiconductor laser incorporating the low specific contact resistance p-contact of the invention.

FIG. 3 shows a cross-sectional view of the edge-emitting Group III-nitride semiconductor laser 100 as an example of a Group III-nitride semiconductor device incorporating the low specific contact resistance p-contact of the invention. Elements of the laser 100 that are the same as those in the laser 1 shown in FIG. 1 are indicated by the same reference numerals and will not be described again here. In the laser 100, the p-contact 110 includes the metal p electrode 12, the p-type GaN contact layer 11, and the intermediate layer 112. The intermediate layer is part of the contact layer of p-type Group-III nitride semiconductor in which atoms of a Group V element other than nitrogen are substituted for a fraction of the nitrogen atoms of the p-type Group III-nitride semiconductor, i.e., the intermediate layer includes p-type $IIIN_{1-x}V_x$, where III is at least one element of Group III, V is at least one element of Group V other than nitrogen, and $0<x\leq1$.

In a first embodiment of the p-contact of the invention, the intermediate layer is a layer of gallium nitride phosphide $GaN_{1-x}P_x$ in which $0<x\leq 1$.

The band gap of gallium nitride phosphide $GaN_{1-x}P_x$ is high enough to allow $GaN_{1-x}P_x$ to be used as an optical material for blue, violet or ultraviolet light. Moreover, changing the value of x changes the band gap over the relatively wide range from 2.3 eV when x=0 (GaP) to 3.4 eV when x=1 (GaN). See, for example, S. Miyoshi and K. Onabe: *Semi-Enipirical Tight-Binding Calculation of the Electronic Structure of $GaP_{1-x}N_x$* (x=0.25, 0.5, 0.75) *Alloys*, P-1, ABSTRACT OF TOPICAL WORKSHOP ON III-V NITRIDES, Sep. 21–23, 1995, Nagoya Congress Center, Nagoya, Japan.

Since phosphorus differs from indium in that its atomic radius is close to that of nitrogen, and since phosphorus atoms readily replace nitrogen atoms in gallium nitride, gallium nitride can easily be doped with phosphorus. Moroever, as noted above, phosphorus has a large bending effect on the band gap of gallium nitride. Therefore, selecting the appropriate value of x in $GaN_{1-x}P_x$ has the potential to reduce the height of the Schottky barrier between the p-contact and the intermediate layer sandwiched between the p-type GaN and the p electrode, and to reduce the specific contact resistance of the p-contact. The band structure of $GaN_{1-x}P_x$ depends on the value of x. An initial value of x may be selected by considering the effect of the value of x on the band structure of the semiconductor, and may be optimized by subsequent experiments to obtain the value of x that provides the lowest voltage drop for a given device current. The band gap decreases with increasing x, and reaches a minimum at x≈0.5. However, it is difficult to produce crystals with values of x close to 0.5 with good crystal uniformity and x-homogeneity. Crystals with values of x≈0.1 are easier to produce with good crystal uniformity and x-homogeneity, and a beneficial reduction in the voltage drop across the p-contact is obtained with a value of x as low as 0.01. Thus, the preferred range of x is $0.01 \leq x \leq 0.5$.

Figure 4A:
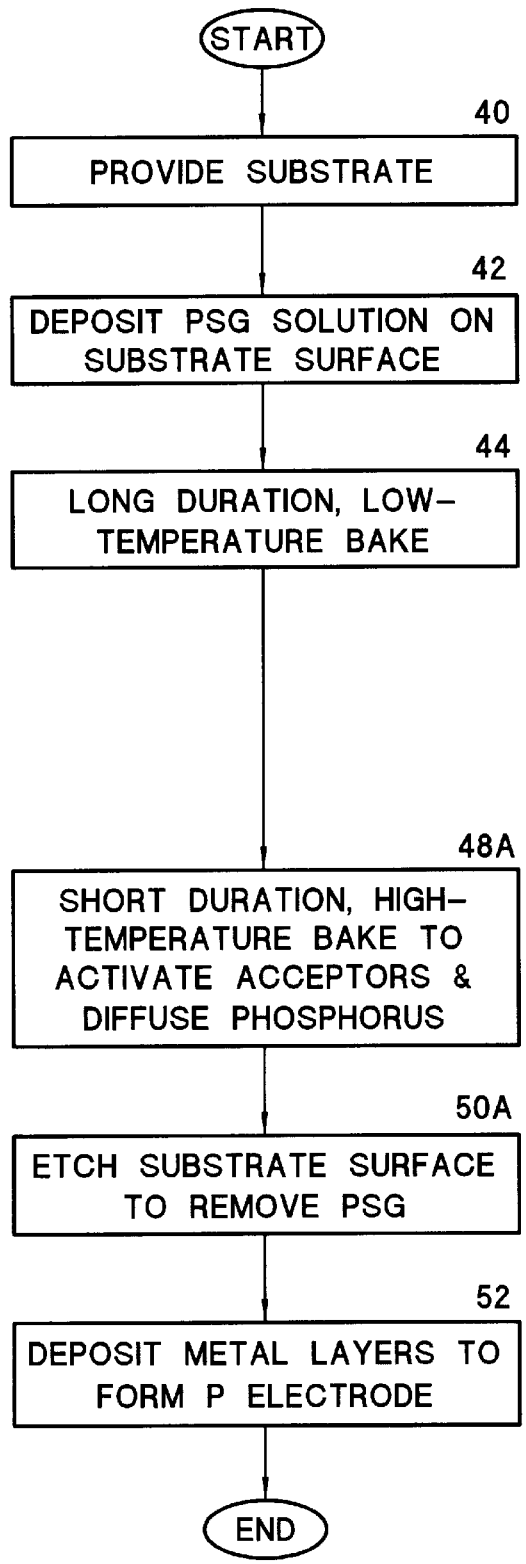
FIG. 4A is a flow chart illustrating the process according to the invention for fabricating the p-contact according to the invention.
Figure 4B:
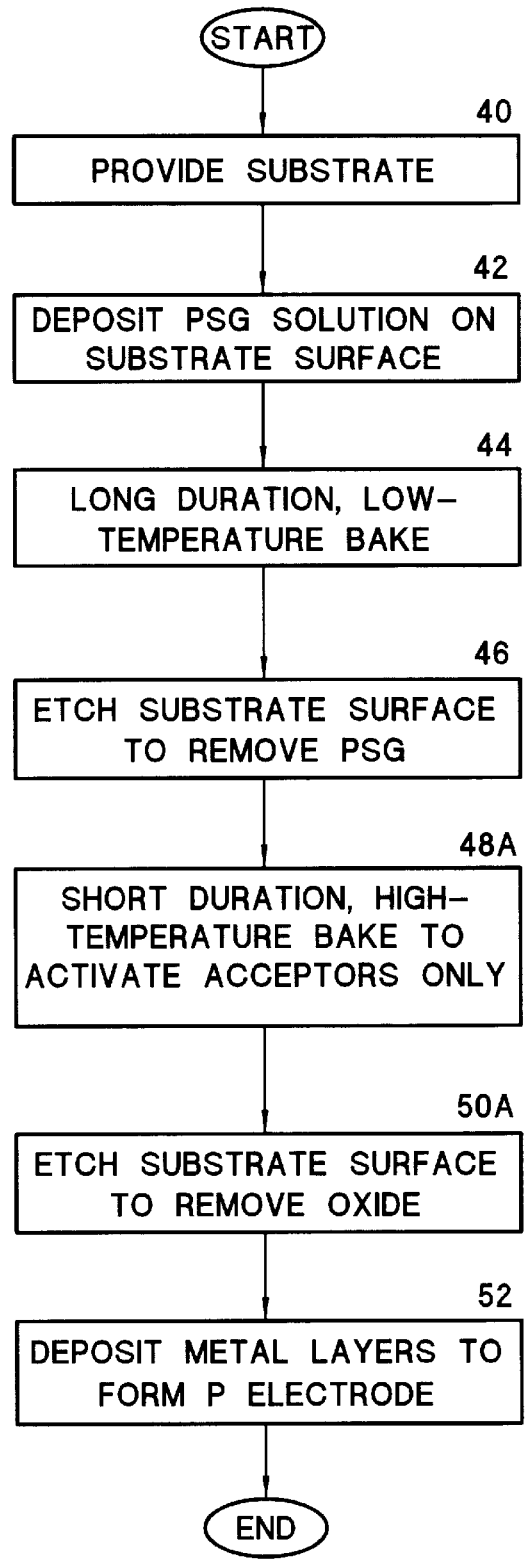
FIG. 4B is a flow chart illustrating the process for making a conventional p-contact that was used to perform comparative testing of the p-contact of the invention.

The ability of an intermediate layer of $GaN_{1-x}P_x$ to lower the specific contact resistance of a p-contact incorporating such layer was confirmed in tests performed on test elements fabricated using the method illustrated by the flow charts of FIGS. 4A and 4B.

The method according to the invention for fabricating an improved element incorporating the p-contact of the invention will now be described with reference to FIG. 4A. The method for fabricating a reference element incorporating a conventional p-contact for use in comparative tests will also be described with reference to FIG. 4B.

Turning first to FIG. 4A, in step 40, a p-type gallium nitride substrate doped with magnesium as the acceptor impurity is provided. In step 42, a solution containing PSG is spin-coated onto the surface of the p-type GaN substrate. At step 44, the substrate is baked for 3.5 hours at 110° C. to evaporate the solvent from the solution. This leaves the surface of the substrate coated with PSG.

In step 48A, the substrate is baked at a temperature of 900° C. for 5 minutes. This activates the Mg dopant in the GaN and additionally causes phosphorus to diffuse from the PSG into the substrate to form the intermediate layer.

In step 50A, the substrate is etched in HF to remove the PSG layer from the surface of the substrate.

In step 52, a one nm-thick layer of nickel and a 200 nm-thick layer of gold are vapor deposited on the surface of intermediate layer, which constitutes the surface of the substrate, to form the p electrode.

In step 58, the specific contact resistance of the improved p-contact formed by the method according to the invention is measured. The process then ends.

The method for fabricating a reference element incorporating a conventional p-contact for use in comparative tests will now be described with reference to FIG. 4B. The process illustrated in FIG. 4B forms a p-contact in which no intermediate layer is sandwiched between the metal electrode and the p-type GaN substrate. Steps in the process illustrated in FIG. 4B that are identical to the process illustrated in FIG. 4A are indicated by the same reference numeral and will not be described again here.

In step 46, the substrate is etched in hydrogen fluoride HF to remove the PSG layer. Consequently, the high-temperature bake performed in next step 48B activates the acceptor impurities in the substrate, but no phosphorus diffuses into the substrate. Hence, no intermediate layer is formed. The HF etch step performed next in step 50B removes a surface oxide film from the exposed surface of the substrate, but does not remove the PSG layer, since this was removed in step 46.

The specific contact resistance of the elements made by the processes shown in FIGS. 4A and 4B are measured after fabrication and prior to annealing. As is well known, annealing decreases the value of the specific contact resistance by a factor of about ten.

Multiple rectangular electrodes with a short side of 75 μm and a long side of 0.50 mm are formed on the surfaces of both the reference element and the improved element. The long sides of the electrodes are parallel to one another and to the short sides of the substrate. The distance between adjacent electrodes varies from 25 μm to 175 μm in 25 μm steps. This arrangement of electrodes enables the contact resistance of the p-contact according to the invention to be compared with that of the conventional p-contact using the transmission line method. Current is passed between adjacent pairs of the electrodes and the voltage drop between the electrodes to the current passing is measured.

Figure 5:
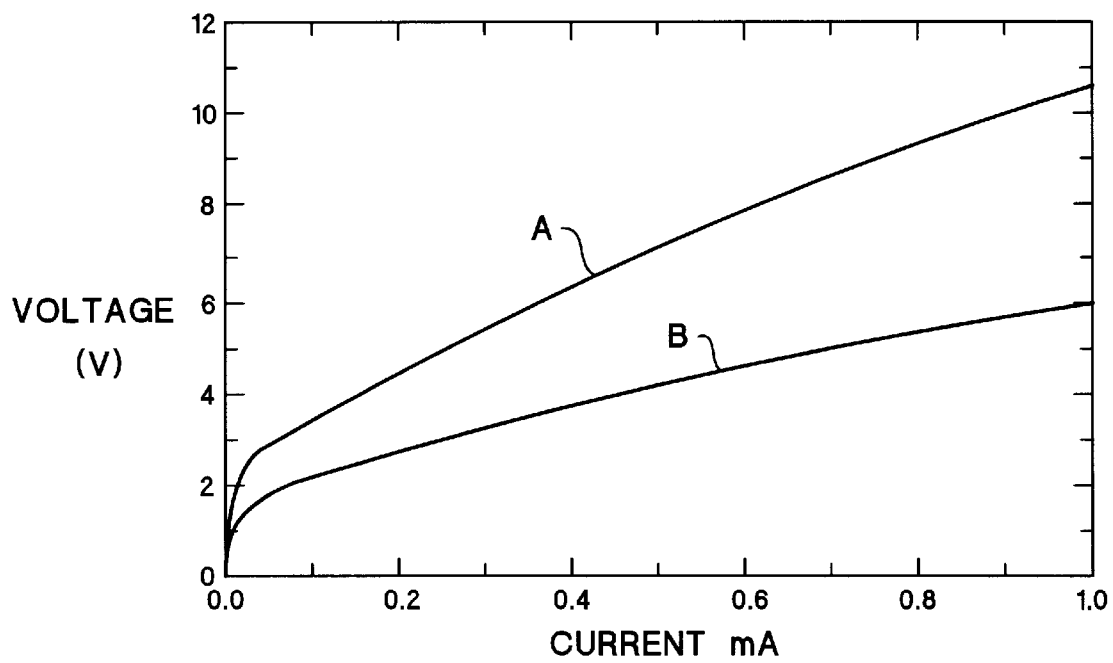
FIG. 5 is a graph showing the voltage and current characteristics of a conventional p-contact and the p-contact according to the invention.

FIG. 5 shows one example of the current and voltage characteristics. Curve A represents the current/voltage characteristic of the conventional p-contact. Curve B represents the characteristics of the p-contact according to the invention. The measurement current is the total current flowing between the electrodes. The maximum current density of the current flowing through the p-contact between the electrodes has a value of several $kA/cm^2$ in the shortest current path between the electrodes. Compared to the conventional p-contact, the p-contact according to the invention has a lower DC resistance due to the significantly lower Schottky barrier in the p-contact according to the invention.

The value of the specific contact resistance determined by using the above measurements in a transmission line model is $1.6\times 10^{-1}$ $\Omega.cm^2$ in the conventional p-contact and $1.1\times 10^{-1}$ $\Omega.cm^2$ in the p-contact according to the invention. Under these conditions, the specific contact resistance of the p-contact according to the invention is significantly less than that of the conventional p-contact. When conditions of the high-temperature bake steps 48A, 48B of the processes described above with reference to FIGS. 4A and 4B are changed those under which little, if any, phosphorus diffusion takes place; for example, to a temperature of 800° C. and a time of 60 minutes, the specific contact resistance is $1.5\times 10^{-1}$ $\Omega.cm^2$ in the conventional p-contact and $2.0\times 10^{-1}$ $\Omega.cm^2$ in the p-contact according to the invention.

Since phosphorus does not diffuse below 800° C. and the crystallinity of the substrate deteriorates above 1,100° C., the high temperature bake step 48A must be performed at a temperature in the range from 800° C. to 1,100° C. Preferably, this step is performed at a temperature between 850° C. and 950° C. In the high-temperature bake step 48A, degradation of the crystallinity of the substrate caused by high temperature, acceptor activation in the GaN:Mg, and phosphorus diffusion from the PSG occur simultaneously. Consequently, all three of these factors should be considered when determining the conditions for performing the high-temperature bake step 48A. To minimize the degradation of the crystallinity of the substrate caused by high temperature, the high-temperature bake step should be performed at a low temperature for a short time. To maximize activation of the acceptors in GaN:Mg, the high-temperature bake step should be performed at a high temperature for a long time. Finally, to achieve optimum diffusion of the phosphorus, the high-temperature bake step should be performed at a high temperature for a relatively short time. For optimum results, the conditions of the high-temperature bake step should be selected so that these conflicting factors are balanced.

In the preferred embodiment, the optimum conditions for acceptor activation are obtained, and the optimum phosphorus diffusion is simultaneously achieved by performing the high-temperature bake step for 5 minutes at a temperature of 900° C. The resulting acceptor concentration is $2 \times 10^{17}$ cm$^{-3}$.

In the improved element, the value of x in the $GaN_{1-x}P_x$ mixed crystal of the intermediate layer is assumed to be in the range from 0.01 and no more than 0.5.

In the process described above, phosphorus atoms thermally diffusing from the PSG replace a fraction of the nitrogen atoms of the p-type gallium nitride to form the intermediate layer composed of GaNP mixed crystal. The intermediate layer can alternatively be formed by thermally diffusing atoms of another Group V element other than nitrogen from glass containing that element.

GaNPAsSb mixed crystal, GaNP mixed crystal, GaNAs mixed crystal, or GaNSb mixed crystal are the preferred constituents of the material of the intermediate layer.

The Group V elements that may be substituted for nitrogen in the gallium nitride material have increasing atomic weights in the order of P, As, and Sb. Since the diffusion rate decreases as the atomic weight increases, the diffusion process must be performed at a higher temperature for a longer time to obtain a predetermined concentration of substitute Group V atoms. On the other hand, the concentration of the substituted element required to produce a specific reduction in the band gap decreases as the atomic weight of the substitution element increases. Consequently, favorably maintaining crystallinity is balanced with simultaneously fostering acceptor activation. The inventor prefers to use essentially the same temperature and time in the high-temperature bake step as are used with phosphorus.

The way in which the mixed crystal of the intermediate layer is formed is not limited to thermal diffusion from glass. Alternative methods include:

thermal diffusion from an atmosphere containing the Group V element, thermal diffusion from a solution of the Group V element in a molten Group III element, implanting ions of the Group V element into the surface of the p-type nitride semiconductor, and introducing the Group V element while the portion of the substrate constituting the intermediate layer is epitaxially grown.

From the perspective of easy integration and low cost using current technology, thermally diffusing the Group V element is preferred.

A further decrease in the specific contact resistance and improved reliability can be expected by doping the intermediate layer with a Group II element impurity. The energy level of the valence band in the intermediate layer can be raised and the height of the Schottky barrier between the metal electrode and the substrate can be lowered by doping the gallium nitride material of the substrate with a Group V element other than nitrogen to form the intermediate layer, as described above. Moreover, the Schottky barrier can be narrowed by doping the intermediate layer with an acceptor impurity such as a Group II element. Narrowing the Schottky barrier increases the tunnelling current between the metal and the intermediate layer and provides a lower specific contact resistance.

Suitable Group II elements that can be used to dope the intermediate layer are Mg, Zn, and MgZn. Doping the intermediate layer narrows the Schottky barrier and additionally increases the acceptor concentration in the p-type GaN substrate.

The intermediate layer can be doped with the Group II element using one of several possible methods, some of which correspond to the doping methods listed above for doping the substrate with the Group V element to form the intermediate layer. For example, possible doping methods for the Group II impurities include thermal diffusion from glass containing the Group II element, thermal diffusion from an atmosphere containing the Group II element, thermal diffusion from a solution of the Group II element in a molten Group III element, implanting ions of the Group II element into the surface of the substrate, introducing the Group II element while the intermediate layer is epitaxially grown, and thermal diffusion from a multilayered metal film containing the Group II element or from an alloy containing the Group II element.

Combining the processes of doping the intermediate layer with the Group II element and the Group V element provides advantages particularly in the combinations set forth below. Further, the Group II elements and the Group V elements described above are freely combined and can be simultaneously doped. However, some of the combined doping processes are more difficult to control than others, as will be noted below.

(1)(a) Sequential thermal diffusion of the Group V element from glass containing the Group V element and thermal diffusion of the Group II impurities from glass containing the Group II element (Easy to control);

(1)(b) Simultaneous thermal diffusion of the Group II impurities and the Group V element from glass containing the Group II element and the Group V element (Easy to control);

(2)(a) Sequential thermal diffusion of the Group V element from an atmosphere containing the Group V element and thermal diffusion of the Group II impurities from an atmosphere containing the Group II element (Moderately difficult to control);

(2)(b) Simultaneous thermal diffusion of the Group II impurities and the Group V element from an atmosphere containing the Group II element and the Group V element (Moderately difficult to control);

(3)(a) Sequential thermal diffusion of the Group V element from a solution of the Group V element in a molten Group III element and thermal diffusion of the Group II impurities from a solution of the Group II element in a molten Group III element (Difficult to control); and (3)(b) Simultaneous thermal diffusion of the Group II impurities and the Group V element from a solution of the Group II element and the Group V element in a molten Group III element (Difficult to control).

In the above-mentioned sequential thermal diffusion processes, thermal diffusion of the Group II impurities may either precede or follow thermal diffusion of the Group V element.

Currently, the method based on thermal diffusion from glass is considered to be optimal. In other circumstances, another of the methods can be optimal.

As described above, a p-contact according to the invention in which an intermediate layer is sandwiched between a p-type Group III-nitride semiconductor and a metal electrode has a low specific contact resistance. The material of the intermediate layer is a p-type Group III-nitride semiconductor in which atoms of a Group V element other than nitrogen have been substituted for a fraction of the nitrogen atoms of the p-type Group III-nitride semiconductor. A semiconductor device incorporating the p-contact according to the invention has a reduced power consumption, higher efficiency and lower parasitic resistance.

The method according to the invention of fabricating a p-contact for Group III nitride semiconductors allows a variety of processing conditions. Therefore, processing conditions that are most compatible with the processing used to fabricate the remainder of the semiconductor device, the available materials, and the technology level can be selected. This simplifies implementation of the fabrication method.

Although this disclosure describes illustrative embodiments of the invention in detail, it is to be understood that the invention is not limited to the precise embodiments described, and that various modifications may be practiced within the scope of the invention defined by the appended claims.

I claim:

1. A Group III-nitride semiconductor device, comprising:

a substrate layer of a p-type Group III-nitride semiconductor;

a metal electrode; and sandwiched between the substrate layer and the metal electrode, an intermediate layer including a Group III-nitride semiconductor in which atoms of a Group V element other than nitrogen have been substituted for a fraction of nitrogen atoms.

2. The Group III-nitride semiconductor device of claim 1, in which the Group III-nitride semiconductor of the intermediate layer is selected from a group consisting of GaNPAsSb mixed crystal, GaNP mixed crystal, GaNAs mixed crystal, and GaNSb mixed crystal.

3. The Group III-nitride semiconductor device of claim 2, in which the intermediate layer additionally includes a high concentration of a Group II element.

4. The Group III-nitride semiconductor device of claim 3, in which the Group II element is selected from a group consisting of magnesium and zinc.

5. The Group III-nitride semiconductor device of claim 1, in which the Group III-nitride semiconductor of the intermediate layer includes $GaN_{1-x}P_x$, $0<x\leq 1$.

6. The Group III-nitride semiconductor device of claim 5, in which $0.01\leq x\leq 0.5$.

7. The Group IIII-nitride semiconductor device of claim 1, in which the intermediate layer additionally includes a high concentration of a Group II element.

8. The Group III-nitride semiconductor device of claim 7, in which the Group II element is selected from a group consisting of magnesium and zinc.

* * * * *